United States Patent [19]

White

[11] Patent Number: 5,582,866
[45] Date of Patent: Dec. 10, 1996

[54] SINGLE SUBSTRATE VACUUM PROCESSING APPARATUS HAVING IMPROVED EXHAUST SYSTEM

[75] Inventor: John M. White, Hayward, Calif.

[73] Assignee: Applied Materials, Inc., Santa Clara, Calif.

[21] Appl. No.: 277,865

[22] Filed: Apr. 14, 1994

Related U.S. Application Data

[63] Continuation of Ser. No. 10,206, Jan. 28, 1993, abandoned.

[51] Int. Cl.$^6$ .................................................. C23C 16/00
[52] U.S. Cl. ...................... 427/248.1; 118/715; 118/725; 118/728; 156/345
[58] Field of Search ................................. 118/715, 725, 118/728; 156/345; 427/248.1

[56] References Cited

U.S. PATENT DOCUMENTS

| | | | |
|---|---|---|---|
| 4,951,601 | 8/1990 | Maydan et al. | 118/719 |
| 5,000,113 | 3/1991 | Wang | 118/715 |
| 5,088,444 | 2/1992 | Ohmine | 118/719 |

OTHER PUBLICATIONS

Joint Development Agreement Between Applied Materials, Inc. (Applicant's Assignee) and two unrelated companies (companies A & B), dated May 29, 1991 (Exhibit A hereto).

*Primary Examiner*—Richard Bueker
*Attorney, Agent, or Firm*—Birgit E. Morris; Lawrence Edelman

[57] ABSTRACT

In a single substrate vacuum processing chamber for processing large glass substrates, a novel vacuum exhaust system is built into the lid of the chamber. A plenum chamber which is connected to a continuous vacuum pump is mounted around a gas dispersion plate, also built into the lid, and has continuous access to the reaction region of the chamber by means of a restricted access passage. The plenum chamber is large with respect to the access passage which provides uniform and continuous evacuation of process gases and particulates from the full periphery of the processing region. This design minimizes the deposition of particulates onto the large area substrate and onto the port by which the substrate enters and leaves the chamber and, by the same design, creates a chamber which has a small volume in relation to the size of the substrate is can process. The close proximity of the plenum chamber and the access passage to the plasma region facilitates the use of a periodic dry etch-clean plasma to help keep these exhaust regions clean between periodic manual cleanings. A further advantage of this design is that when the chamber is to be manually cleaned periodically, the lid is easily swung open, giving ready access to the plenum chamber in which particulates have accumulated, and without disturbing gas delivery and exhaust lines which are all built into the lid.

20 Claims, 2 Drawing Sheets

SINGLE SUBSTRATE VACUUM PROCESSING APPARATUS HAVING IMPROVED EXHAUST SYSTEM

This is a continuation of U.S. application Ser. No. 08/010,206 filed Jan. 28, 1993 now abandoned.

This invention relates to a novel vacuum processing chamber for processing large glass substrates. More particularly, this invention relates to a vacuum processing chamber having a novel exhaust system.

BACKGROUND OF THE INVENTION

The semiconductor industry has been using single substrate (silicon wafer) processing chambers for some time because the chamber volume can be minimized, contamination of the substrate has been reduced, process control is increased and, consequently, yields are improved. Further, vacuum systems have been developed, such as described in Maydan et al, U.S. Pat. No. 4,951,601, that allow several sequential processing steps to be carried out in a plurality of vacuum processing chambers connected to a central transfer chamber, so that several processing steps can be performed on a substrate without its leaving a vacuum environment. This further reduces the possibility of contamination of the substrates.

Recently the interest in providing large glass substrates with up to one million active thin film transistors thereon for applications such as active matrix TV and computer displays has been heightened. These large glass substrates, generally of a size up to about 350×450×1 mm, require vacuum processing chambers for deposition of thin films thereon. The basic methods and processing chambers, e.g., plasma enhanced chemical vapor deposition (PECVD), physical vapor deposition (PVD), etch chambers and the like, are similar to those used for depositing layers and patterning thin films on silicon wafers. A practicable system that can perform multiple process steps on glass substrates is disclosed by Turner et al in copending U.S. patent application Ser. No. 010,684, filed concurrently herewith entitled "VACUUM PROCESSING APPARATUS HAVING IMPROVED THROUGHPUT".

In conventional single substrate PECVD chambers, the substrate to be processed is supported by a heated susceptor and reaction gases are fed to the chamber via a gas dispersion plate mounted above and generally parallel to the substrate. The gas dispersion plate and susceptor are connected across an RF source and, when power and reactant or precursor gases are turned on, a plasma from the precursor gases forms in the region between the gas dispersion plate and the substrate. By manipulation of gas flows, temperatures, and pressure in the chamber maintained by a vacuum exhaust system, most of the particulates in the plasma region can be carried by the gases away from the susceptor and substrate and to the exhaust system. However, particulates remain a problem and many modifications of equipment have been made to reduce this problem. Nevertheless, the vacuum chambers must be cleaned periodically to remove particulates or solid material that has deposited on the walls, gas dispersion plate and other components conventionally employed in vacuum processing chambers.

In the case of large glass substrates, this problem is exacerbated because, in order to have a minimum chamber volume, the area between the walls and the substrate is quite small. At the same time, in order to achieve good film thickness uniformity as well as other film properties, it is necessary to provide a gas exhaust geometry in the chamber such that the rate at which the gas exits the substrate deposition region of the chamber is substantially uniform everywhere along the periphery of the substrate. Further, in the vacuum system described by Turner et al, referred to hereinabove, a plurality of processing chambers can be connected to a transfer chamber. In order to be accessible to a robot in an adjacent transfer chamber, an entry port for the large glass substrate must be located on one side of the chamber. It is also very important that particulates not collect near the area of the entry port so that particulates are not deposited directly onto substrates as they are brought in and out of the processing chamber, nor are they exported to the transfer chamber because this would obviously lead to the eventual contamination of the whole system.

Thus a need to improve the exhaust system of a single substrate vacuum chamber for processing large glass substrates was manifest, and the prompt removal of particulates in the processing chamber is absolutely necessary.

SUMMARY OF THE INVENTION

My invention comprises several improvements in a single substrate vacuum processing chamber for processing large substrates that allow prompt and effective removal of particulates and easy access to the chamber for periodic cleaning. The chamber of the invention has two parts; the main body of the chamber contains a heater/support for the glass substrate and a closable port for ingress and egress of the substrate to be processed; and a lid portion, which includes a gas dispersion plate and a novel vacuum exhaust system.

The vacuum exhaust system of the invention comprises a plenum chamber connected to an exhaust port and vacuum pump, which plenum chamber is built into the lid so as to completely surround the gas dispersion plate and be above and surrounding the substrate periphery. A restricted passageway connects the plenum chamber and the plasma processing region between the gas dispersion plate and the substrate to be processed. Spent gases and particulates are thus able to be withdrawn uniformly from the whole plasma processing region during processing, including the side of the chamber in which the entry port is situated. The exhaust system, which is above the plasma processing region and above the substrate, thus draws particulates out of the chamber directly from the plasma processing region, before particles can deposit on the substrate or on the entry port, which are both situate below the plasma processing region. Further, since the exhaust system is adjacent to the plasma processing region, a dry etchant source gas can be introduced periodically between deposition runs and a plasma generated to clean the gas dispersion plate and the walls of the chamber, which also helps to keep the adjacent exhaust plenum chamber clean.

In addition, periodic thorough manual cleaning of the chamber can be performed quickly, reducing the downtime of the equipment, due to the fact that all of the chamber surfaces which get exposed to extraneous deposition and process-generated particulates can be easily accessed by simply opening the hinge-mounted lid.

DETAILED DESCRIPTION OF THE INVENTION

The present invention can be best described with reference to FIGS. 1 and 2. Like numerals are used for like parts in both FIGS. 1 and 2.

Figure 1:
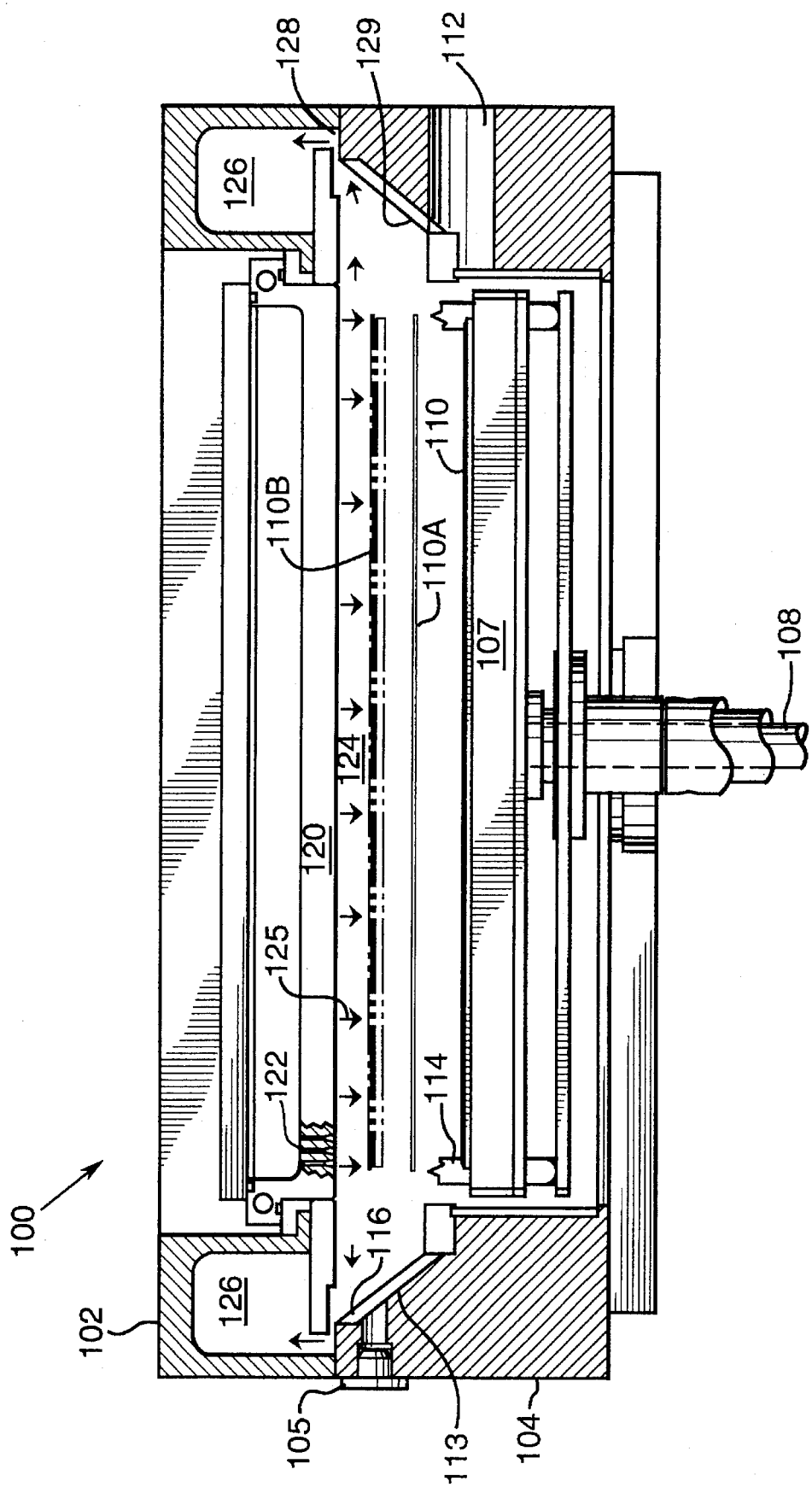
FIG. 1 is a cross sectional view of a single substrate PECVD chamber useful herein, partly in schematic, incorporating several features of the invention.

FIG. 1 is a cross sectional view of a PECVD chamber useful herein. The chamber 100 is made in two parts; a lid portion 102 and a processing chamber body portion 104. The two parts 102, 104 are attached by means of a hinge 105. A vacuum is maintained in the chamber 102 when the lid is closed by means of a single O-ring seal 106 (see FIG. 2).

The processing chamber body 104 includes a heater/support 107 for a substrate 110, which support 107 can be moved up and down by means of a shaft 108 in conventional manner. When the loading cycle begins, the support 107 is in its lowest position. The glass substrate 110 to be processed is admitted to the chamber body 104 via an entry port 112 while it is supported on the blade of a robot (not shown). A set of pins 114, lift the glass substrate 110 from the blade to an intermediate position, shown as 110A, when the robot blade can be withdrawn from the chamber body 104. The heater/support 107 is then raised into its processing position, picking up the glass substrate 110 as it proceeds upward, to bring the glass substrate 110 into its processing position, which position can be varied according to particular process requirements, shown in dotted line as 110B.

The lid 102 includes a gas dispersion plate 120 which is connected to a source of one or more processing gases and has a plurality of openings 122 distributed uniformly across the surface to supply plasma precursor or reactant gases to the plasma/processing region 124. Gas flow is in the direction of the arrows 125, as shown. The dispersion plate 120 is generally rectangular and of similar shape and size as the susceptor 107 and the substrate 110. The openings 122 are arranged on the dispersion plate 120 in a rectangular, square or, preferably, equilateral triangular grid.

The exhaust system of the invention comprises a plenum chamber 126; an exhaust passage 128 between the plasma region 124 and the plenum chamber 126; and an exhaust channel 130, which is connected to a pressure-controlling throttle valve 131 which connects to a constant vacuum pump (not shown). The plenum chamber 126 completely surrounds the plasma/processing region 124 and is connected to said region by means of a quite restricted exhaust passage 128 formed by the inner wall 113 of the chamber 104 and the lid 102. Thus a narrow, uniform gap for exhaustion of gases is present around the whole periphery of the substrate.

The gap can also be formed by a series of openings uniformly placed around the periphery of the substrate. The openings can be shaped if desired in order to achieve the present objective of providing an exhaust flow that negates the effect of vacuum pumping from only one side of the substrate and plenum chamber, and so that a uniform exhaust around the whole periphery of the substrate is achieved, even at high gas pressures. The walls 129 of the chamber body 104 form a continuous and smoothly tapering flow path for the exhaust gas to reach the passage 128, which further helps to prevent accumulation of particles in the chamber body 104 and the exhaust passage 128.

The exhaust passage 128 can be formed from a single opening around the plasma/processing region or by a plurality of uniformly spaced openings between the chamber body 104 and the plenum chamber 126. Because the plenum chamber 126 is generally large with respect to the exhaust passage 128, and is open around its whole circumference via exhaust passage 128, good and uniform evacuation from the whole of the plasma/processing region 124 is achieved.

Figure 2:
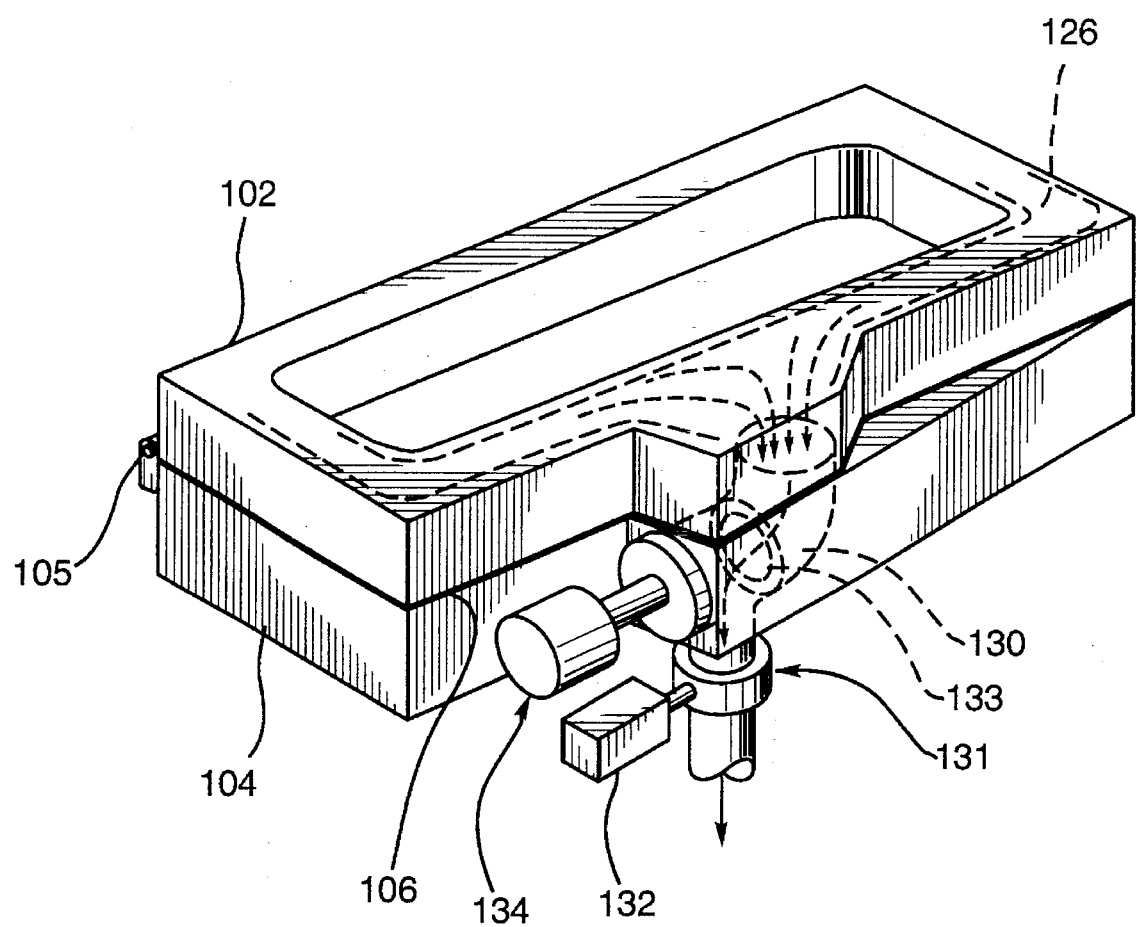
FIG. 2 is a three dimensional view of the vacuum system of the invention.

Referring to FIG. 2, a preferred embodiment of an exhaust channel 131 and valve system 131, 133 is shown. The exhaust channel 131 is machined out of the chamber body 104. A throttle valve 131 inserted into the channel 131 having an actuator 132 can regulate the flow of material from the plenum chamber 126. An isolation valve 133 and its actuator 134 ensure a unidirectional gas flow.

By placing the exhaust system of the invention above the substrate 110 and above the chamber entry port 112, particles do not collect on the surface of the substrate 110 or at the entry port 112, but instead all reaction by-products, excess reaction gases and particulates are drawn across the substrate 110, up along the walls 129 of the chamber to the exhaust passage 128 and into the plenum chamber 126 by the vacuum pump via the exhaust channel 130. Further, since the exhaust passage 128 is adjacent to the plasma processing region 124, the periodic etch-clean plasma helps to remove particulates that may deposit on the exhaust passage 128 and in the plenum chamber 126 in addition to cleaning the gas dispersion plate 120 and the surrounding walls 129 of the chamber body 104, especially in the exhaust channel 130 and the throttle valve 131, which are difficult to clean. Further, any particulates that are not exhausted from the chamber 100 tend to collect in the plenum chamber 126 rather than on the substrate 110 or other surfaces in the chamber body 104. The plenum chamber 126 can be readily manually cleaned periodically by opening the lid 102. Because the unique hinged lid 102 is sealed to a single O-ring seal 106, and because the restricted pumping passage is actually formed between components in the lid and components in the chamber 100 when the lid is closed, the lid is readily opened and all of the parts that tend to accumulate particulates are readily accessible for periodic manual cleaning as well. The accessibility of both the chamber body 104 and the plenum chamber 126 reduces downtime of the chamber 100, further improving the economics of the present system.

In a further embodiment that prevents condensation of particulates and other matter in the chamber 104, circulating hot water heats the vacuum chamber 104 and the gas distribution system in the lid 102 to about 75° C. The exhaust channel 130 and the throttle valve 131, after insertion into the channel 130, is thus also heated to about 75° C. and the system is closer to the cleaning plasma than would be possible with externally connected valves, and more efficient cleaning is possible.

The symmetrical placement of the continuous or multiple exhaust passages 128 about the periphery of the susceptor 107 offers many advantages otherwise available only with expensive multiple pumping ports and channels. The symmetry allows a symmetric gas flow across the substrate 110, even though the exhaust passages 128 are relatively close by. Thus the size of the vacuum chamber 104 can be reduced and the relatively short distance between the susceptor 107 and the exhaust passages 128 can be easily cleaned by the cleaning plasma, the ions of which have a finite pathlength. Also the symmetry is maintained irrespective of the position of the susceptor 107 in the chamber 104, which is preferably varied for desired processing conditions.

Thus the present exhaust system prevents or minimizes deposition of particulates onto the substrate and the entry port of the processing chamber, resulting in less contamination of the substrates and the whole vacuum processing system. The placement of the exhaust system adjacent to the plasma processing region helps reduce deposition of particulates in the vacuum processing chamber itself, and facilitates etch cleaning of the chamber body and plenum chamber by an etch-clean plasma. Further, the provision of a large exhaust plenum chamber with access to the processing chamber over its whole perimeter provides uniform exhaust of gases and particulates from the chamber.

Still another advantage of the present processing chamber is that the volume of the processing chamber can be smaller and the chamber walls closer to the periphery of the substrate when the exhaust system is above the processing area. In conventional chambers, a space has to be provided for gases and particulates to pass between the walls and the substrate being processed, without depositing particulates onto the surface of the substrate or in the region of the entry port. In the present design, the exhaust plenum chamber, which is above the processing region, is large enough to provide uniform and efficient exhaust, but almost no extra space need be provided between the substrate and the walls of the body of the chamber.

A small process chamber has cost advantages, e.g., lower material and fabrication costs, as well as the provision of a small system footprint which lowers equipment space costs. Also a small chamber has productivity advantages as well; it is easier and faster to clean, both by dry etching and manually, and it has higher substrate throughput by virtue of being faster to fill the chamber up to processing pressure with process gas, and faster to evacuate after each processing cycle.

Although the present invention has been described with respect to particular embodiments, various substitutions of parts and materials can be made without departing from the spirit of the invention. The relative size of the restricted gas passageway 128 and the plenum chamber 126 can vary; the gas passageway can be continuous, or non-continuous with uniform sized openings uniformly spaced about the periphery of the chamber; or the size of the openings and/or spaces may be non-uniform, providing evacuation of the chamber is made uniform. In order to achieve constant pressure in the plenum chamber 126, its lateral dimensions relative to the gas flow should be substantially larger than the relevant lateral dimension of the restricted gas passageway 128.

Various changes in reactor design can be made also as will be apparent to one skilled in the art and are meant to be included herein. The scope of the invention is thus meant to be limited only by the scope of the appended claims.

I claim:

1. A vacuum processing chamber comprising
   a) a lid portion having a gas dispersion plate and a vacuum exhaust system therein;
   b) a chamber body comprising a support for a substrate to be processed; and
   c) a processing region formed between said gas dispersion plate and said support when said lid portion is closed against said chamber body.

2. A vacuum processing chamber according to claim 1 wherein said vacuum exhaust system comprises a plenum chamber surrounding said gas dispersion plate, and a restricted passage between said processing region and said plenum chamber.

3. A vacuum processing chamber according to claim 2 wherein the restricted passage is formed by a close fitting between a portion of said lid portion and a portion of said chamber body to form an opening around a periphery of said support, said opening being narrow compared to the width of said plenum chamber.

4. A vacuum processing chamber according to claim 3 wherein the restricted passage is formed by a plurality of openings around the periphery of said support.

5. A vacuum processing chamber according to claim 3 wherein said restricted passage comprises an annular opening surrounding the periphery of said support.

6. A vacuum processing chamber according to claim 2 wherein said restricted passage is variably sized around the periphery of said support so that an exhaust flow of products of said processing gas is substantially uniform around a periphery of said processing region to thereby negate the net effect of vacuum pumping along only one side of said plenum chamber.

7. A vacuum processing chamber according to claim 2 wherein a passageway formed between walls of said chamber body and said lid portion tapers inwardly from a periphery of said processing region to said restricted passage.

8. A vacuum processing chamber according to claim 2 wherein said chamber body includes a vacuum exhaust channel communicating through a port with said plenum chamber when said lid portion and said chamber body are closed together.

9. A vacuum processing chamber according to claim 1 wherein said chamber body further comprises a closable port disposed on a side of said processing region away from said lid portion for ingress and egress of said substrate.

10. A vacuum processing chamber according to claim 1 wherein said chamber body includes a vacuum exhaust channel connected on one end to a vacuum pump and connected on another end, when said lid portion and said chamber body are closed together, to said vacuum exhaust system.

11. A vacuum processing chamber according to claim 1 wherein said lid portion is hingedly attached to said chamber body to thereby close with and open from said chamber body.

12. A vacuum processing chamber according to claim 10 further comprising a single O-ring seal mounted between said lid portion and said chamber body.

13. A method of processing a substrate in a vacuum chamber comprising
   a) closing a lid having a source of processing gas therein against a chamber body including a substrate support and a substrate mounted thereon opposite said source to form a processing region;
   b) passing said processing gas into said processing region,
   c) at least partially reacting said gas and said substrate to form a processing residue; and
   d) exhausting said processing residue upward into said lid.

14. A method according to claim 13 wherein said exhausting step includes providing a plenum chamber in said lid connected to a restricted passage between said processing region and said lid and drawing said processing residue through said restricted passage.

15. A method according to claim 14 wherein said closing step forms said restricted passage between said lid and said chamber body.

16. A method according to claim 14 wherein said exhausting step further comprises drawing said processing residue from said plenum chamber through an exhaust channel formed in said chamber.

17. A processing chamber comprising
   a) a chamber body accommodating a substrate therein and having a wall with an aperture therethrough; and
   b) a lid removably and sealingly closing said aperture and including a pathway at a central part of said lid for the injection of processing gas into said chamber body and at least one exhaust channel substantially surrounding a periphery of said lid for exhausting said processing gas from said chamber body.

18. A chamber according to claim 17 further comprising at least one hinge by which said lid pivots on said chamber body.

19. A chamber according to claim 17 wherein said substrate is supported in said chamber body in a horizontal orientation and wherein said lid is disposed over said substrate when said lid is sealed to said chamber body.

20. A chamber according to claim 18 wherein said pathway comprises a gas dispersion plate fixed to said lid, wherein said dispersion plate includes a plurality of openings directed towards and distributed over substantially the whole area of said substrate.

* * * * *